(12) United States Patent
Yamada et al.

(10) Patent No.: US 9,362,196 B2
(45) Date of Patent: Jun. 7, 2016

(54) SEMICONDUCTOR PACKAGE AND MOBILE DEVICE USING THE SAME

(75) Inventors: Keiju Yamada, Kawasaki (JP); Takashi Yamazaki, Yokohama (JP); Masatoshi Fukuda, Yokohama (JP); Yasuhiro Koshio, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 13/181,737

(22) Filed: Jul. 13, 2011

(65) Prior Publication Data

US 2012/0015687 A1    Jan. 19, 2012

(30) Foreign Application Priority Data

Jul. 15, 2010 (JP) .................. 2010-160980

(51) Int. Cl.
*H01L 23/02* (2006.01)
*H01L 23/31* (2006.01)
*H01L 23/498* (2006.01)
(Continued)

(52) U.S. Cl.
CPC ...... *H01L 23/3128* (2013.01); *H01L 23/49805* (2013.01); *H01L 23/552* (2013.01); *H01L 24/97* (2013.01); *H01L 23/49816* (2013.01); *H01L 23/49827* (2013.01); *H01L 24/45* (2013.01); *H01L 24/48* (2013.01); *H01L 24/73* (2013.01); *H01L 2224/32225* (2013.01); *H01L 2224/45144* (2013.01); *H01L 2224/48227* (2013.01); *H01L 2224/73265* (2013.01); *H01L 2224/97* (2013.01); *H01L 2924/00014* (2013.01); *H01L 2924/014* (2013.01); *H01L 2924/01005* (2013.01); *H01L 2924/01006* (2013.01); *H01L 2924/01029* (2013.01); *H01L 2924/01033* (2013.01); *H01L 2924/01047* (2013.01); *H01L 2924/01079* (2013.01); *H01L 2924/15311* (2013.01); *H01L 2924/181* (2013.01); *H01L 2924/3025* (2013.01)

(58) Field of Classification Search
None
See application file for complete search history.

(56) References Cited

U.S. PATENT DOCUMENTS

| 5,047,898 | A | * | 9/1991 | Cooke et al. ............. 361/679.33 |
| 6,143,587 | A | * | 11/2000 | Omizo .......................... 438/106 |
| 6,400,037 | B1 | * | 6/2002 | Omizo .......................... 257/797 |

(Continued)

FOREIGN PATENT DOCUMENTS

| JP | 09-223761 | 8/1997 |
| JP | 10-284873 | 10/1998 |

(Continued)

OTHER PUBLICATIONS

JP2009218484 English translation, 15 pgs.*

(Continued)

*Primary Examiner* — David E Graybill
(74) *Attorney, Agent, or Firm* — Oblon, McClelland, Maier & Neustadt, L.L.P

(57) ABSTRACT

According to an embodiment, a semiconductor package includes a semiconductor chip mounted on an interposer board, a encapsulant sealing the semiconductor chip, and a conductive shielding layer covering the encapsulant and at least part of a side surface of the interposer board. The interposer board has plural vias through an insulating substrate. A part of the plural vias has a cutting plane exposing to the side surface of the interposer board and cut in a thickness direction of the interposer board. The cutting plane of the via is electrically connected to the conductive shielding layer.

7 Claims, 12 Drawing Sheets

(51) Int. Cl.
  *H01L 23/552* (2006.01)
  *H01L 23/00* (2006.01)

(56) References Cited

U.S. PATENT DOCUMENTS

| | | | |
|---|---|---|---|
| 7,989,928 B2* | 8/2011 | Liao et al. | 257/659 |
| 8,212,339 B2* | 7/2012 | Liao et al. | 257/659 |
| 8,212,340 B2* | 7/2012 | Liao | 257/660 |
| 2005/0157476 A1* | 7/2005 | Goudarzi | 361/760 |
| 2006/0249842 A1* | 11/2006 | Isa et al. | 257/734 |
| 2009/0002967 A1* | 1/2009 | Asami | 361/816 |
| 2009/0256244 A1* | 10/2009 | Liao et al. | 257/660 |
| 2010/0172116 A1 | 7/2010 | Yorita et al. | |
| 2010/0207259 A1* | 8/2010 | Liao et al. | 257/660 |
| 2010/0214390 A1* | 8/2010 | Tsujino et al. | 347/238 |
| 2011/0006408 A1* | 1/2011 | Liao | 257/660 |
| 2012/0015687 A1* | 1/2012 | Yamada et al. | 455/550.1 |
| 2012/0292772 A1 | 11/2012 | Yorita et al. | |

FOREIGN PATENT DOCUMENTS

| | | |
|---|---|---|
| JP | 2002-353349 | 12/2002 |
| JP | 2004-297554 | 10/2004 |
| JP | 2009-218484 | 9/2009 |
| JP | 2010-114291 A | 5/2010 |
| JP | 2011-124413 | 6/2011 |

OTHER PUBLICATIONS

U.S. Appl. No. 13/357,866, filed Jan. 25, 2012, Yamada, et al.
Combined Chinese Office Action and Search Report issued Oct. 31, 2013, in Chinese Patent Application No. 201110199379.X with English translation and English translation of category of cited documents.
Chinese Office Action issued Jul. 7, 2014, in China Patent Application No. 201110199379.X (with English translation).
Office Action issued Jan. 27, 2015, in Japanese Patent Application No. 2011-155437 (with English language translation).
Office Action issued Apr. 22, 2014, in Japanese Patent Application No. 2011-155437 with English translation.

* cited by examiner

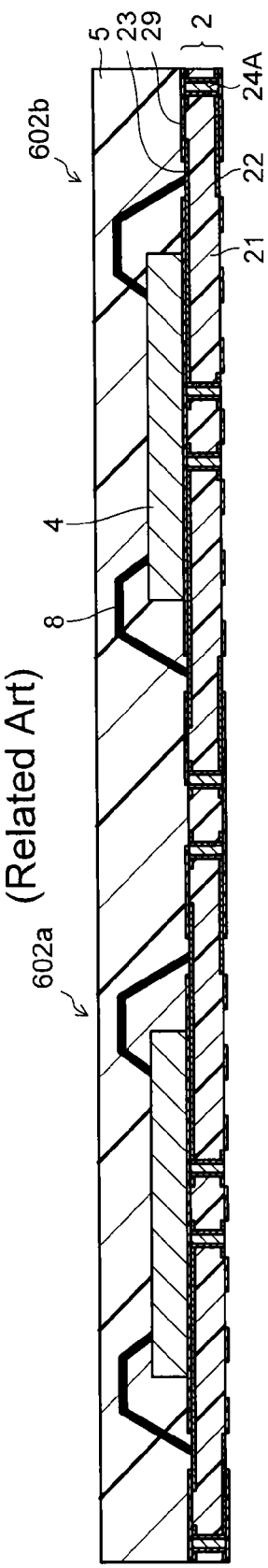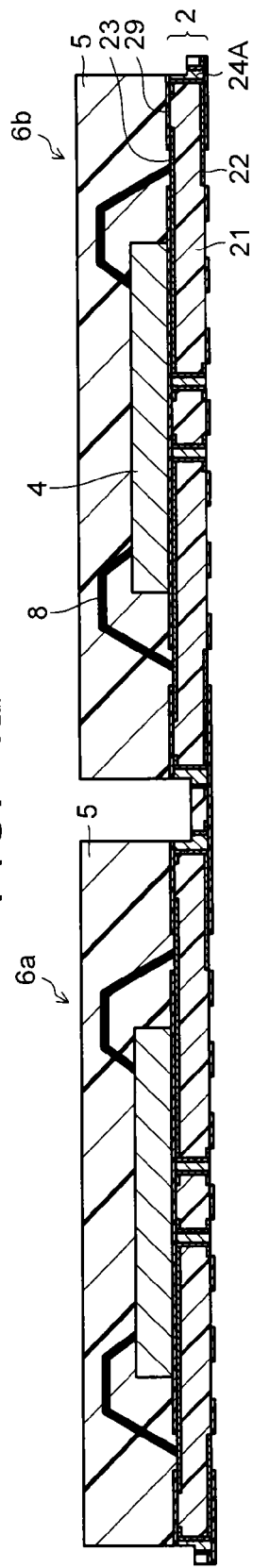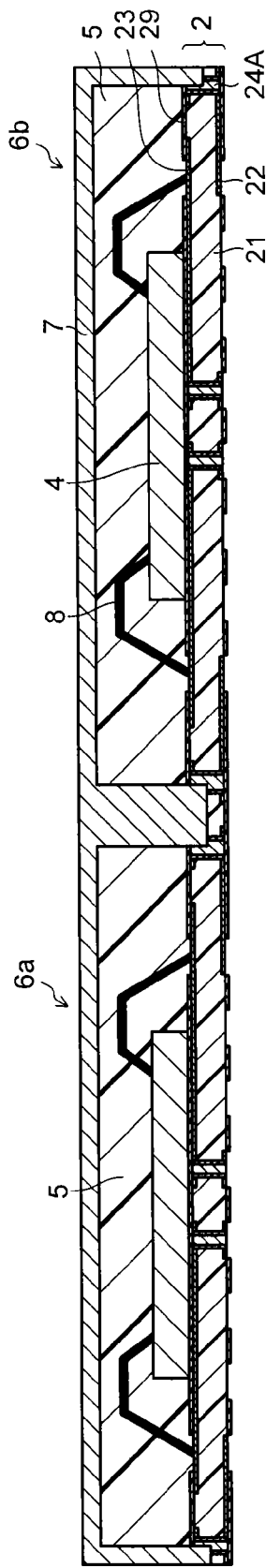

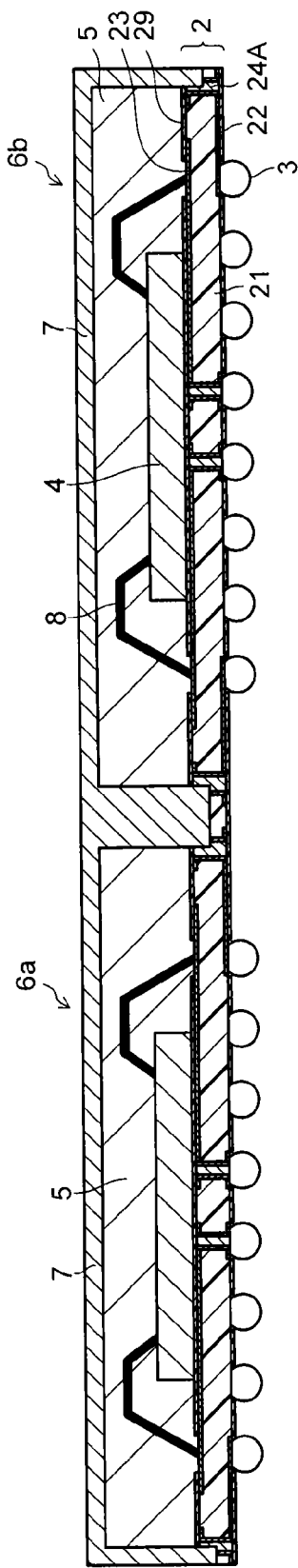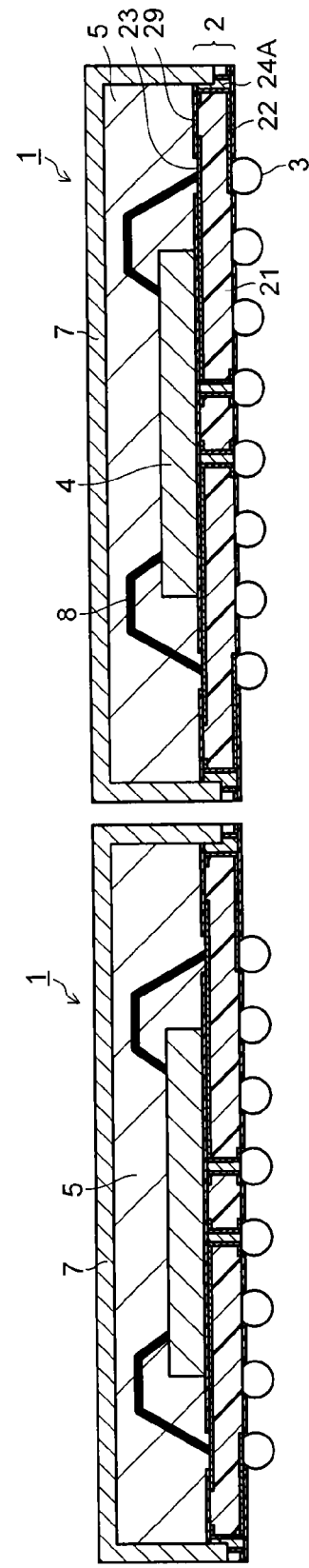

US 9,362,196 B2

SEMICONDUCTOR PACKAGE AND MOBILE DEVICE USING THE SAME

CROSS-REFERENCE TO RELATED APPLICATION

This application is based upon and claims the benefit of priority from Japanese Patent Application No. 2010-160980, filed on Jul. 15, 2010; the entire contents of which are incorporated herein by reference.

FIELD

Embodiments described herein relate generally to a semiconductor package and a mobile device using the same.

BACKGROUND

A semiconductor device used for a mobile device represented by a cellular phone is required to suppress a leakage of unnecessary electromagnetic wave toward outside in order to prevent a bad effect on communication properties. A semiconductor package having a shielding function is therefore applied thereto. As the semiconductor package having the shielding function, the one having a structure in which a shielding layer is provided along an outer surface of an encapsulant sealing a semiconductor chip mounted on an interposer board is known.

A semiconductor package using an interposer board in which vias connected to a ground wiring are arranged at an outer peripheral side to suppress the leakage of the unnecessary electromagnetic wave from a side surface of the interposer board is known. It is required to enhance electrical and mechanical connection reliability between the shielding layer and the ground wiring of the interposer board in the semiconductor package. Further, it is required to suppress the leakage of the unnecessary electromagnetic wave from the side surface of the interposer board without increasing a size of the semiconductor package.

BRIEF DESCRIPTION OF THE DRAWINGS

FIG. 12A to FIG. 12E are views illustrating a manufacturing process of the semiconductor package illustrated in FIG. 1.

DETAILED DESCRIPTION

According to an embodiment, a semiconductor package including an interposer board, external connection terminals provided at a first surface of the interposer board, a semiconductor chip mounted on a second surface of the interposer board, an encapsulant formed on the second surface of the interposer board to seal the semiconductor chip, and a conductive shielding layer provided to cover the encapsulant and at least part of a side surface of the interposer board, is provided. The interposer board includes a first wiring layer formed at a first surface of an insulating substrate, a second wiring layer formed at a second surface of the insulating substrate, and plural vias through the insulating substrate. A part of the plural vias has a cutting plane exposed to the side surface of the interposer board and cut in a thickness direction of the interposer board. The cutting plane of the via is electrically connected to the conductive shielding layer.

Figure 1:
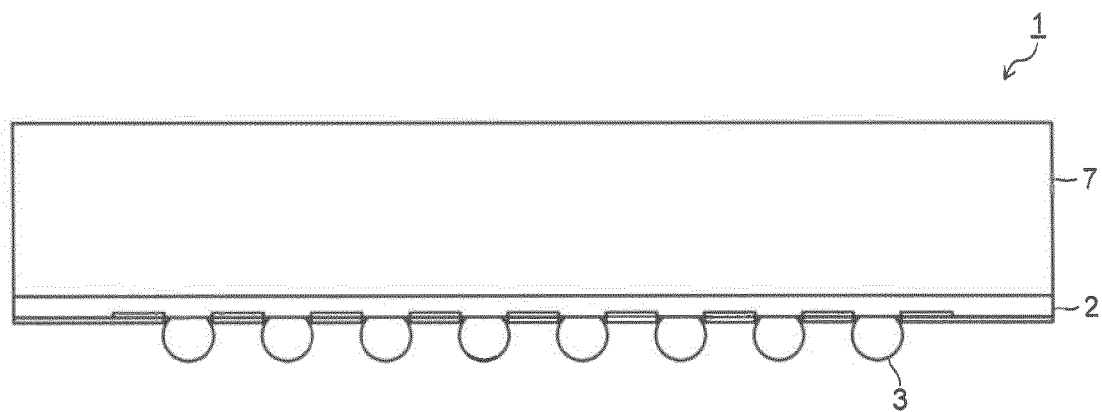
FIG. 1 is a side view illustrating a configuration of a semiconductor package according to an embodiment.
Figure 2:
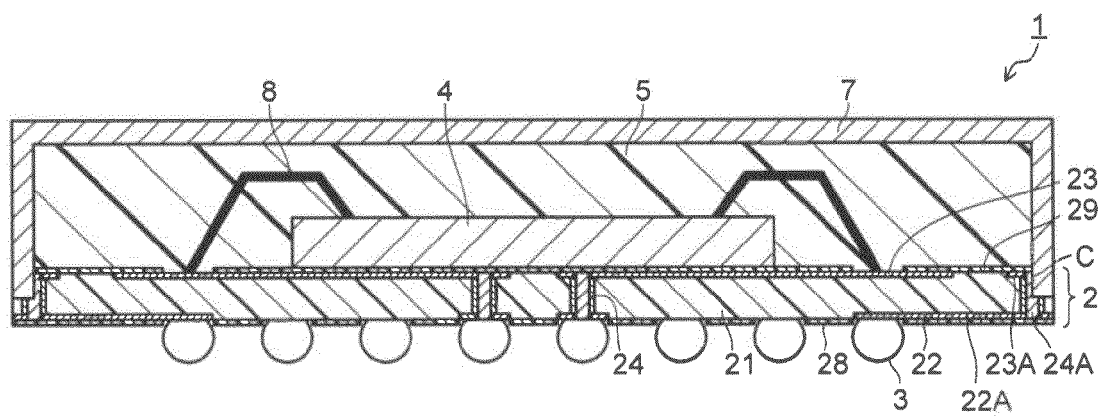
FIG. 2 is a sectional view of the semiconductor package illustrated in FIG. 1.
Figure 3:
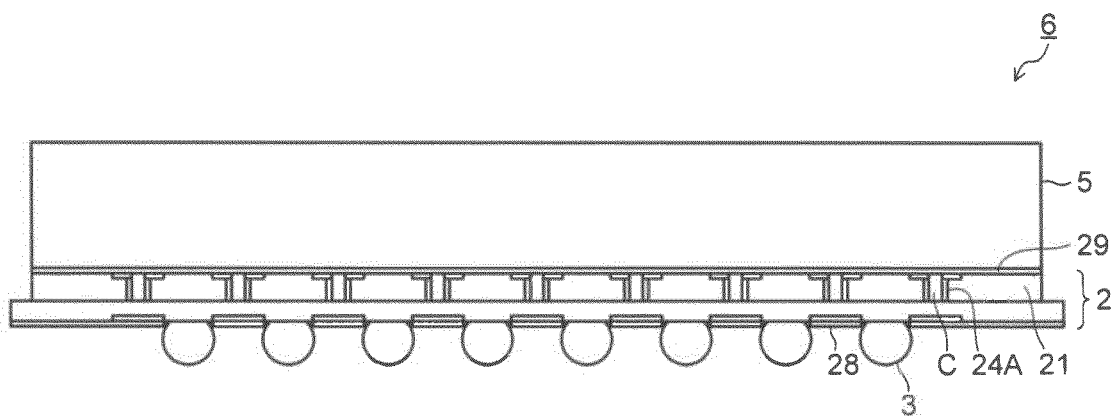
FIG. 3 is a side view illustrating a state before a conductive shielding layer is formed at the semiconductor package illustrated in FIG. 1.
Figure 4:
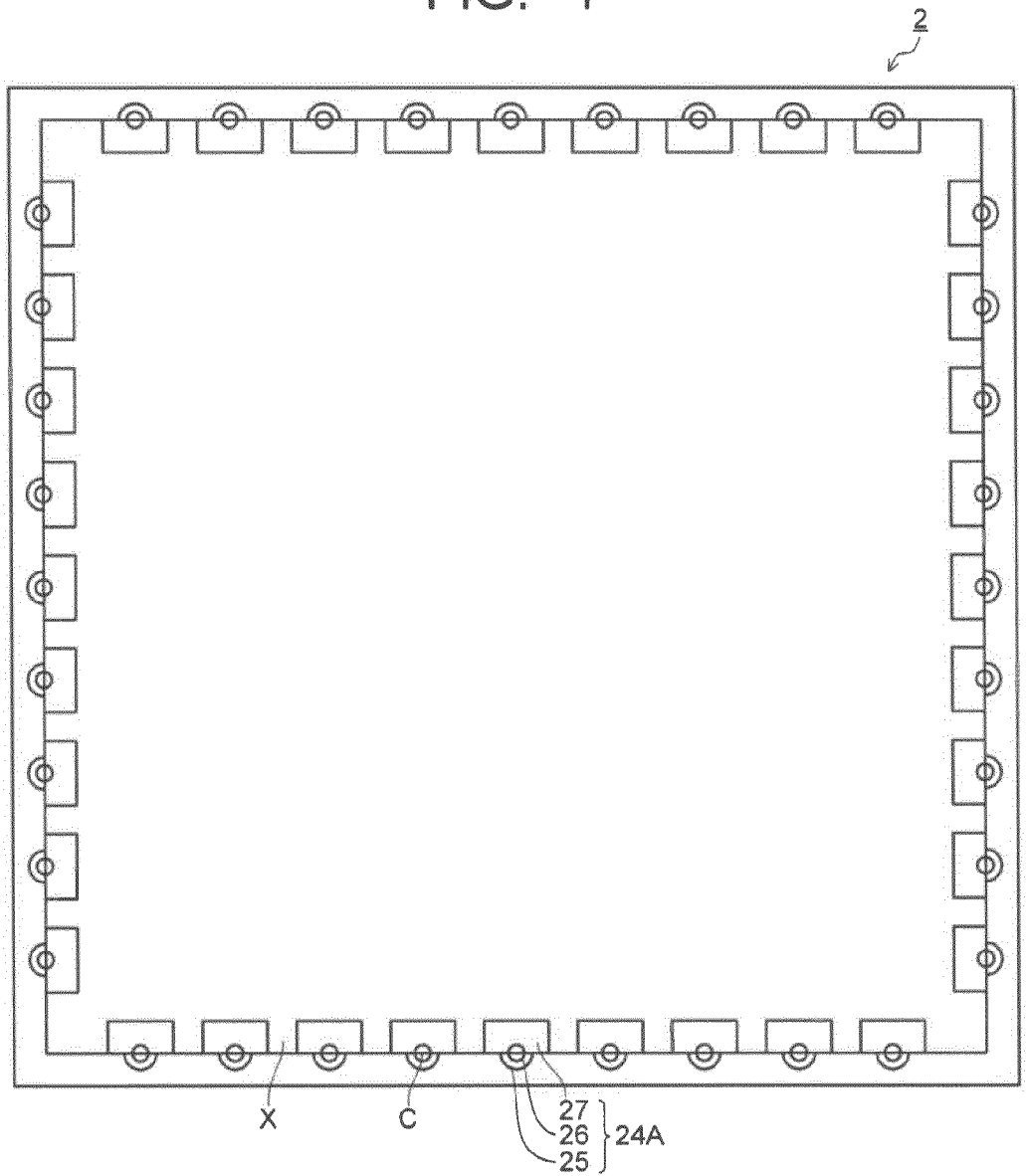
FIG. 4 is a plan view illustrating an example of an interposer board used for the semiconductor package illustrated in FIG. 1.
Figure 5:
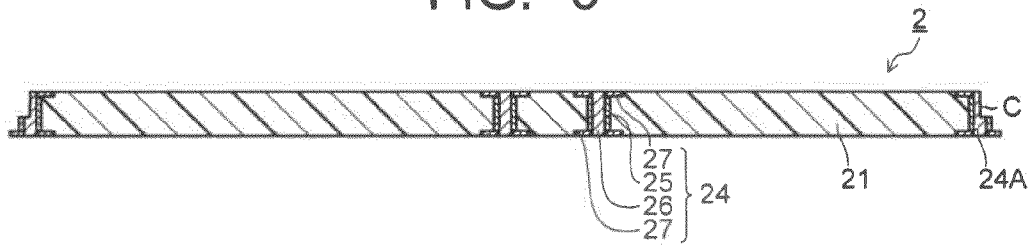
FIG. 5 is a sectional view of the interposer board illustrated in FIG. 4.

A semiconductor package according to a first embodiment is described with reference to the drawings. FIG. 1 is a side view illustrating the semiconductor package according to the first embodiment. FIG. 2 is a sectional view of the semiconductor package illustrated in FIG. 1. FIG. 3 is a side view illustrating a state before a conductive shielding layer is formed in the semiconductor package illustrated in FIG. 1. FIG. 4 is a plan view illustrating an example of an interposer board used for the semiconductor package illustrated in FIG. 1. FIG. 5 is a sectional view of the interposer board illustrated in FIG. 4.

A semiconductor package 1 illustrated in these drawings is a semiconductor package having a shielding function in which a conductive shielding layer 7 is formed at an FBGA (Fine pitch Ball Grid Array) 6 including an interposer board 2, solder balls 3 provided as external connection terminals at a first surface of the interposer board 2, a semiconductor chip 4 mounted on a second surface of the interposer board 2, and an encapsulant 5 sealing the semiconductor chip 4.

The interposer board 2 has an insulating substrate 21 as an insulating substrate. A first wiring layer 22 is provided at a first surface (lower surface), and a second wiring layer 23 is provided at a second surface (upper surface) of the insulating substrate 21. The wiring layers 22, 23 each are not limited to a conductive layer in a single-layer structure, but each may be the one made up of two or more layers of conductive layers. The interposer board 2 includes vias 24 through the insulating substrate 21 to electrically connect the first wiring layer 22 and the second wiring layer 23. The wiring layers 22, 23, and the vias 24 are made up of a copper foil, conductive paste containing silver or copper, and nickel plating, gold plating, or the like is performed on a surface according to need.

The via 24 of the interposer board 2 includes a conductive layer 25 formed at an inner surface of a hole through the insulating substrate 21, a padding material 26 filled in a hollow part inside the conductive layer 25, and lands 27, 27 electrically connecting the conductive layer 25 and the wiring layers 22, 23 as illustrated in FIG. 5. The padding material 26 is made up of, for example, an insulating resin, or a conductive resin. The padding material 26 is preferable to be formed by a material superior in adhesiveness with the conductive shielding layer 7. When the padding material 26 is formed by a conductive material, lowering of a contact resistance value between the via 24 and the conductive shielding layer 7 can be expected because a contact area with the conductive shielding layer 7 increases. The via 24 may be the one in which a metallic material (copper or the like) is filled in the hole by plating and so on.

The solder balls 3 are provided at the first surface (the surface where the first wiring layer 22 is provided) of the interposer board 2. The solder balls 3 are electrically connected to the first wiring layer 22. A chip mounting area X is provided at the second surface (the surface where the second wiring layer 23 is provided) of the interposer board 2. A signal wiring, a ground wiring, and so on of the second wiring layer 23 are provided at the chip mounting area X in addition to a chip mounting part though they are not illustrated in FIG. 4. The interposer board 2 includes solder resist layers 28, 29 formed at the first and second surfaces.

The semiconductor chip 4 is mounted on the second surface of the interposer board 2. Electrode pads (not-illustrated) provided at an upper surface of the semiconductor chip 4 are electrically connected to the second wiring layer 23 of the interposer board 2 via bonding wires 8 such as Au wires. Further, the encapsulant 5 sealing the semiconductor chip 4 together with the bonding wires 8 and so on is formed at the second surface of the interposer board 2. The encapsulant 5 and at least part of a side surface of the interposer board 2 are covered by the conductive shielding layer 7.

The conductive shielding layer 7 is preferable to be formed by a metal layer of which resistivity is low to prevent leakage of unnecessary electromagnetic wave radiated from the semiconductor chip 4 and the wiring layers 22, 23 of the interposer board 2 inside the encapsulant 5, and for example, the metal layer made up of copper, silver, nickel or the like is applied. A thickness of the conductive shielding layer 7 is preferable to be set based on the resistivity thereof. For example, it is preferable to set the thickness of the conductive shielding layer 7 such that a sheet resistance value which is found by dividing the resistivity of the conductive shielding layer 7 by the thickness becomes 0.5Ω or less. The sheet resistance value of the conductive shielding layer 7 is set to be 0.5Ω or less, and thereby, it is possible to suppress the leakage of the unnecessary electromagnetic wave from the encapsulant 5 with good reproducibility.

The unnecessary electromagnetic wave radiated from the semiconductor chip 4 and so on is shut off by the conductive shielding layer 7 covering the encapsulant 5, and therefore, the leakage toward outside is prevented. There is a possibility that the unnecessary electromagnetic wave leaks from the side surface of the interposer board 2. A part of the vias 24, namely, a via 24A connected to ground wirings 22A, 23A is arranged at an outer peripheral part of the interposer board 2 as illustrated in FIG. 2 to FIG. 5 in the semiconductor package 1 of this embodiment. The via 24A has a cutting plane C cut in a thickness direction of the interposer board 2, and the via 24A is disposed such that the cutting plane C is exposed to the side surface of the interposer board 2.

The first and second wiring layers 22, 23 include the ground wirings 22A, 23A. The ground wirings 22A, 23A are disposed at the outer peripheral part to expose to the side surface of the interposer board 2. Further, the via 24A connected to the ground wirings 22A, 23A is disposed at the outer peripheral part of the interposer board 2. The via 24A has the cutting plane C cut in the thickness direction of the interposer board 2, and is disposed to expose the cutting plane C to the side surface of the interposer board 2. The conductive shielding layer 7 is formed to cover a part of the side surface of the interposer board 2, and therefore, the conductive shielding layer 7 is electrically connected to the ground wiring 23A, and further is electrically connected to the cutting plane C of the via 24A.

The conductive shielding layer 7 and the via 24A are electrically connected through the cutting plane C of the via 24A, and therefore, it is possible to enhance a connection state between the conductive shielding layer 7 and the via 24A. Specifically, it is possible to lower the contact resistance between the conductive shielding layer 7 and the via 24A. The connection state between the conductive shielding layer 7 and the cutting plane C of the via 24A may be electrically connected at high frequency through a thin insulator without being limited to a state of directly connected (direct current connection).

It is preferable that a cutting plane of the conductive layer 25 and a cutting plane of the padding material 26 are included in the cutting plane C of the via 24A. FIG. 4 and FIG. 5 illustrate a state in which the via 24A is cut to pass through a center of the via 24A. The contact area of the conductive shielding layer 7 and the cutting plane C of the via 24A thereby increases, and therefore, it is possible to further improve the connection state between the conductive shielding layer 7 and the via 24A. Note that the cutting plane C of the via 24A is not necessarily pass through the center of the via 24A, but a part of the via 24A may be included in the cutting plane C.

Figure 6:
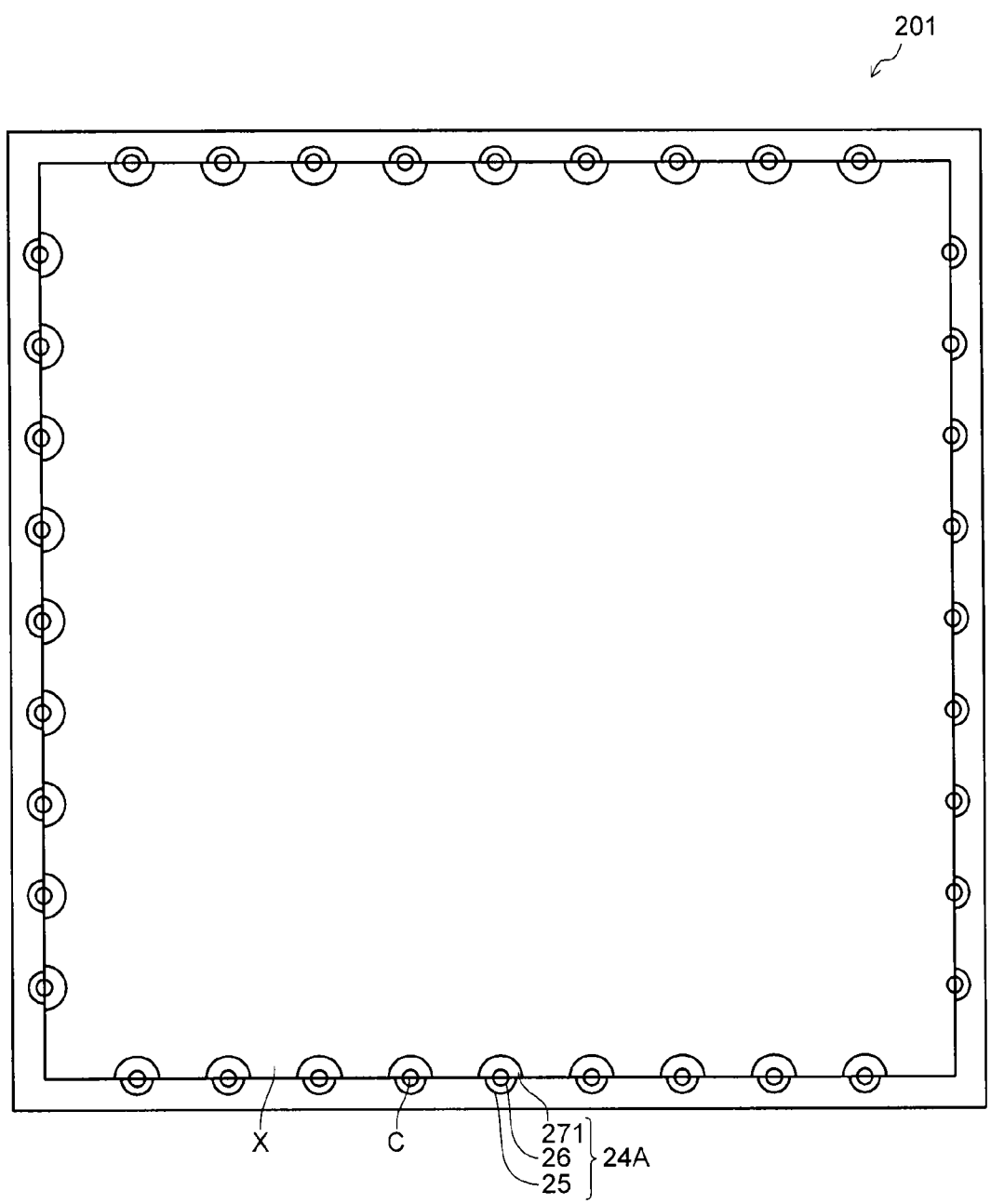
FIG. 6 is a plan view illustrating another example of the interposer board used for the semiconductor package illustrated in FIG. 1.

When the via 24A is cut, a shape of the land 27 is preferable to be a rectangle as illustrated in FIG. 4. A rectangle as illustrated in FIG. 4 and a semicircle as illustrated in FIG. 6 are conceivable as the shape of the land 27 of the cut via 24A. The rectangle land 27 illustrated in FIG. 4 is the one in which, for example, a square land is cut. A semicircle land 271 on an interposer board 201 illustrated in FIG. 6 is the one in which, for example, a circle land is cut. When the circle land is cut as illustrated in FIG. 6, an area of a cutting plane of the land 271 is easy to vary affected by variation of a position of a dicing line. On the other hand, it is possible for the rectangle land 27 illustrated in FIG. 4 to make the area of the cutting plane constant even when the position of the dicing line varies.

Further, when the via 24A is cut, it is preferable that the vias 24A are not disposed at four corners of the interposer board 2. The vias 24A disposed at the four corners are cut in a dicing process twice, and therefore, separation and so on of the copper foil from the interposer board 2 is easy to occur. Accordingly, it is preferable not to dispose the vias 24A at the four corners of interposer board 2. Note that the vias 24A which are to be cut may be disposed at the four corners of the interposer board 2 when there is no possibility that damage or breakdown of the vias 24A caused by the separation and so on of the copper foil may occur in the dicing process.

The vias 24A illustrated in FIG. 2 to FIG. 5 each have the cutting plane C in which a part of the via 24A in the thickness direction (a penetration direction of the via 24) is cut in the thickness direction of the interposer board 2. The cutting plane C of the via 24A has a shape in which a part of the via 24A in the thickness direction is cut from the second surface side of the interposer board 2. An end portion at the first surface side and a vicinity part thereof of the interposer board 2 of the via 24A are covered by the insulating substrate 21. The conductive shielding layer 7 is formed to cover the cutting plane C in which a part of the via 24A in the thickness direction is cut and a stepped surface generated by cutting a part of the via 24A. It is thereby possible to enhance a covering property of the FBGA 6 by the conductive shielding layer 7 and a connectivity between the conductive shielding layer 7 and the cutting plane C of the via 24A.

Figure 7:
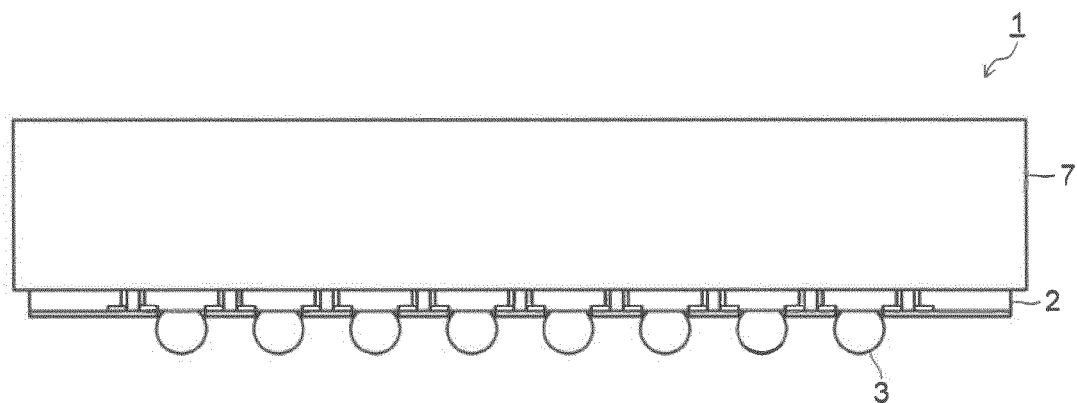
FIG. 7 is a side view illustrating another configuration of a semiconductor package according to the embodiment.
Figure 8:
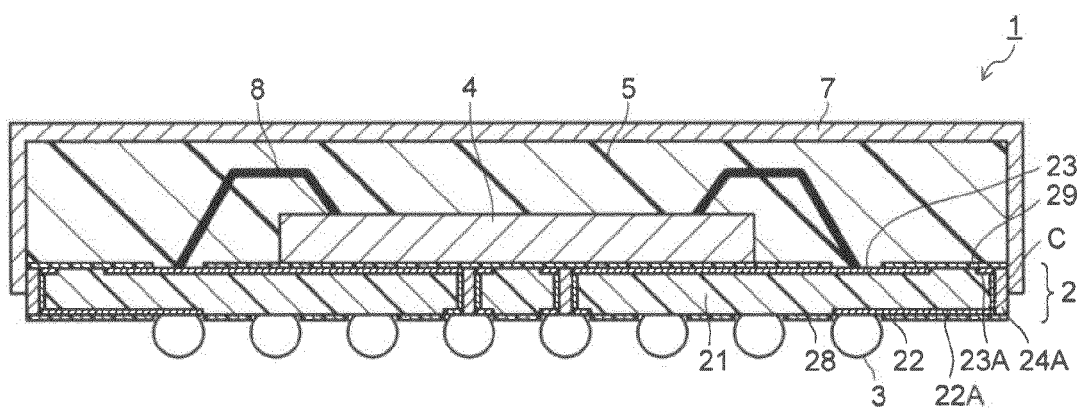
FIG. 8 is a sectional view of the semiconductor package illustrated in FIG. 7.

As illustrated in FIG. 7 and FIG. 8, the via 24A may have the cutting plane C in which a whole of the via 24A in the thickness direction (the penetration direction of the via 24A) is cut in the thickness direction of the interposer board 2. The cutting plane C of the via 24A illustrated in FIG. 7 and FIG. 8 has a shape in which the whole of the via 24A in the thickness direction is cut. The conductive shielding layer 7 is formed to cover a part of the cutting plane C of the via 24A in the thickness direction from the second surface side of the interposer board 2. A part of the cutting plane C which is not covered by the conductive shielding layer 7 is exposed to the side surface of the interposer board 2. The conductive shielding layer 7 may be formed to cover all of the cutting plane C. In this case, the conductive shielding layer 7 may be electrically connected to the ground wiring 22A at the first wiring layer 22.

The whole of the via 24A is cut in the semiconductor packages 1 illustrated in FIG. 7 and FIG. 8, and therefore, it is possible to suppress an increase of an area of the semiconductor package 1. For example, when an interposer board in which a via which is not cut is disposed at an outer peripheral part is used, a length of one edge of a semiconductor package increases twice or more of a width of a land of the via compared to an interposer board in which the via is not disposed at the outer peripheral part thereof. On the other hand, when the interposer board 2 in which the via 24A which is cut at the center is disposed at the outer periphery is used, an increasing amount of the length of one edge of the semiconductor package 1 is suppressed to approximately a width of the land of the via 24. When the width of the land of the via 24 is 0.2 mm, the length of the one edge of the package increases 0.4 mm or more if the via which is not cut is disposed, but the increasing amount of the length of one edge of the package can be suppressed to approximately 0.2 mm if the cut via is disposed.

The via 24A having the cutting plane C electrically connected to the conductive shielding layer 7 has an effect to suppress the leakage of the electromagnetic wave from the side surface of the interposer board 2. The via 24A penetrates the interposer board 2, and electrically connected to the conductive shielding layer 7 by the cutting plane C, and therefore, it is possible to effectively suppress the leakage of the electromagnetic wave from a whole of the side surface of the interposer board 2. For example, when the via is provided only at a part of the interposer board 2 in the thickness direction although the via connected to the ground wiring is disposed at the outer peripheral part of the interposer board 2, the electromagnetic wave leaks from a part where the via does not exist in the thickness direction. On the other hand, the via 24A through the interposer board 2 is disposed, and thereby, it is possible to effectively suppress the leakage of the electromagnetic wave from the side surface of the interposer board 2 because the via 24A brings out a shielding effectiveness for the whole of the side surface of the interposer board 2.

It is preferable to expose the cutting planes C of the plural vias 24A to the side surface of the interposer board 2 per one edge to suppress the leakage of the electromagnetic wave from the side surface of the interposer board 2. Further, a leakage suppressing effect (magnetic field shielding effectiveness) of the electromagnetic wave improves as an interval between the cutting planes C of the vias 24A exposed to the side surface of the interposer board 2 is narrow. It is preferable that a maximum interval between the cutting planes C of the vias 24A is set to be 4 mm or less. A disposing interval of the vias 24A is not limited to a regular interval. The disposing interval of the vias 24A may not be constant. It is preferable to dispose the vias 24A such that the maximum interval of the cutting planes C becomes 4 mm or less even in such a case.

Figure 9:
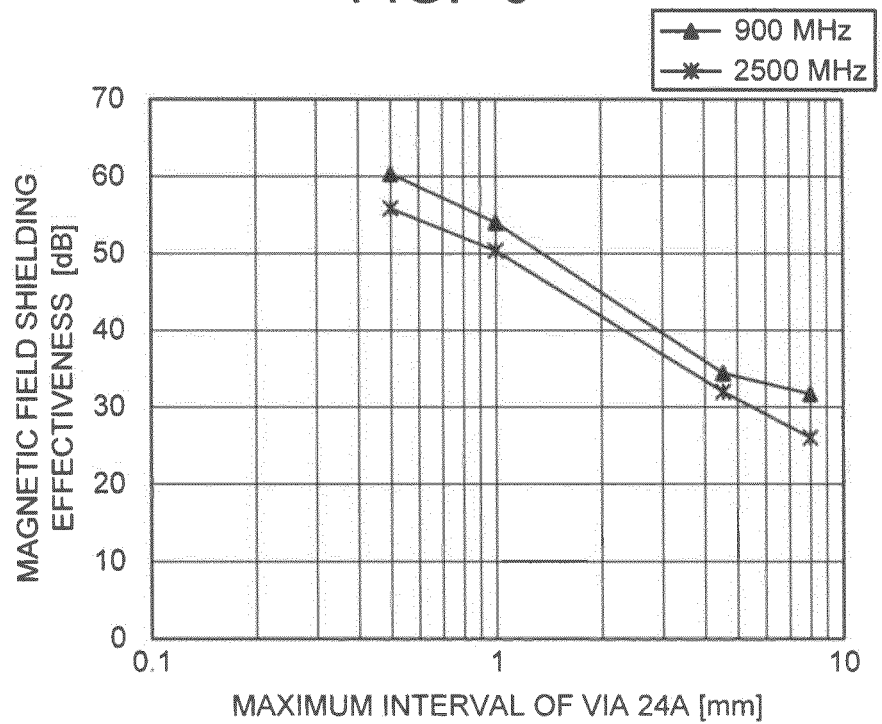
FIG. 9 is a view representing a relationship between a maximum interval of cutting planes of vias and a magnetic field shielding effectiveness of the semiconductor package.

A relationship between the maximum interval of the cutting planes C of the vias 24A at the side surface of the interposer board 2 and the magnetic field shielding effectiveness is represented in FIG. 9. FIG. 9 represents results in which the magnetic field shielding effectiveness at respective frequencies of 900 MHz, 2500 MHz are measured. A measurement sample is a semiconductor package of which length of one edge is 8.15 mm, height (including the solder ball) is 1.06 mm. Noise is terminated by feeding power from external to solder balls, and by propagating from the solder balls to a board through a signal wiring of an interposer board and vias. A conductive shielding layer, an exposed via, a ground wiring, ground pins of the solder balls are electrically connected.

A magnetic field strength is measured by scanning at a distance of 1 mm just above an encapsulant of the package (reference surface). The magnetic field shielding effectiveness is found from a difference between the magnetic field strengths at the reference surface when a shielding layer exists and when the shielding layer does not exist. A thickness of the conductive shielding layer is set to be 50 μm at an upper surface of the package and 70 μm at a side surface thereof. A resistivity of the conductive shielding layer is approximately 30 μΩcm. The magnetic field shielding effectiveness measured as stated above is represented in FIG. 9. FIG. 9 represents the magnetic field shielding effectiveness when the maximum interval of the cutting planes C of the vias 24A is changed.

As represented in FIG. 9, a logarithm of the maximum interval of the cutting planes C of the vias 24A and the magnetic field shielding effectiveness has a linear relationship. It can be seen that the magnetic field shielding effectiveness is lowered when the maximum interval of the cutting planes C of the vias 24A is wide. It is preferable that the maximum interval of the cutting planes C of the vias 24A is narrow to enhance the magnetic field shielding effectiveness. In the semiconductor package 1 used at a mobile device, it is required to make the magnetic field shielding effectiveness 34 dB or more at 900 MHz. Accordingly, the maximum interval of the cutting planes C is preferable to be set at 4 mm or less. It is higher for the effect to narrow the interval of the cutting planes C of the vias 24A. However, the interval of the vias 24A is subjected to the restrictions on the structure, and thereby, the interval of the cutting planes C of the vias 24A is set at 0.2 mm or more.

Further, it is preferable that the conductive shielding layer 7 and the ground wiring of the interposer board 2 are brought into contact with low resistance to enhance the magnetic field shielding effectiveness by the conductive shielding layer 7. Specifically, it is preferable that contact resistances between the conductive shielding layer 7 and the ground wiring 23A and the cutting plane C of the via 24A are lowered. A result in which a relationship between the contact resistance between the conductive shielding layer 7 and the cutting plane C of the via 24A and the magnetic field shielding effectiveness by the conductive shielding layer 7 is found by means of an electromagnetic field simulation is represented in FIG. 10.

An analysis by means of the electromagnetic field simulation is performed as for a semiconductor package of which length of one edge is 8.1 mm, height (including the solder ball) is 1.06 mm. A specific shape of the semiconductor package is as follows: a height of the interposer board 2 is 0.1 mm; a diameter of the via 24A is 0.08 mm; a width of the land 27 of the via 24A is 0.2 mm; thicknesses of the first and second wiring layers 22, 23 are each 18 μm. The via 24A is the one in which copper is filled in the hole. When the conductive shielding layer 7 is in contact with an upper half of the cutting plane C of the via 24A, the contact area per one piece of via 24A becomes 0.0076 mm². The vias 24A are disposed with 1 mm pitch at a regular interval, and they are also disposed at the four corners of the interposer board 2. The number of vias 24A is 33 pieces.

The noise is terminated by feeding power from external to the solder balls, and by propagating from the solder balls to the board through the signal wiring of the interposer board and the vias. The conductive shielding layer, the exposed via, the ground wiring, the ground pins of the solder balls are electrically connected. The magnetic field strength is calculated at a position of 1 mm just above the encapsulant of the package (reference surface). The magnetic field shielding effectiveness is found from the difference between the maximum values of the magnetic field strengths at the reference surface when the shielding layer exists and when the shielding layer does not exist. The thickness of the conductive shielding layer is set to be 50 μm both at the upper surface and the side surface of the package. The resistivity of the conductive shielding layer is approximately 30 μΩcm. The result of the electromagnetic field simulation performed as stated above is represented in FIG. 10.

Figure 10:
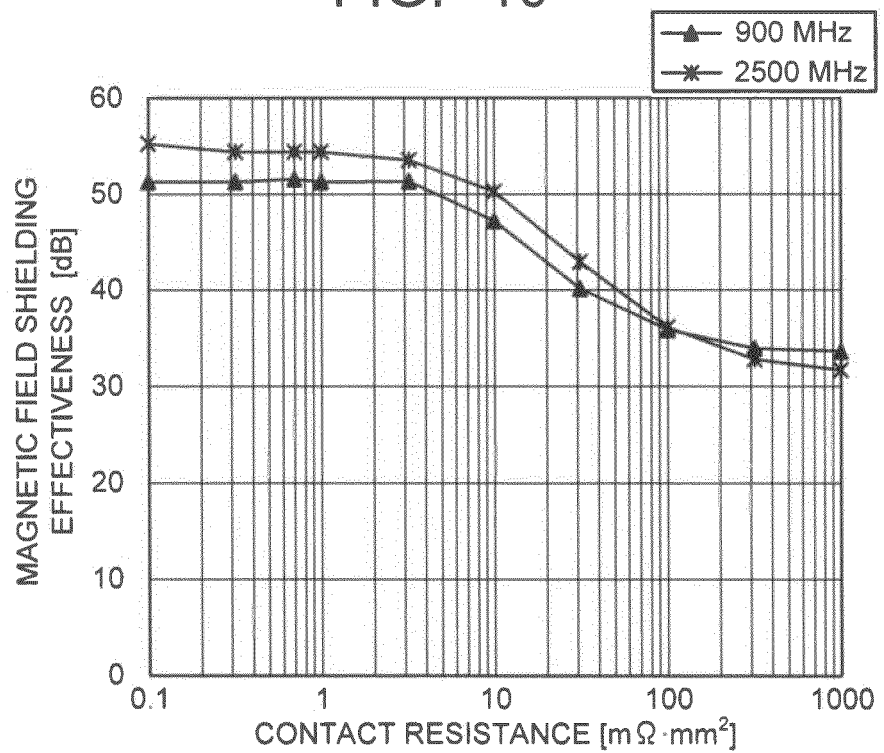
FIG. 10 is a view representing a relationship between a contact resistance of the conductive shielding layer and the cutting plane of via and the magnetic field shielding effectiveness of the semiconductor package.

As represented in FIG. 10, the magnetic field shielding effectiveness becomes high as the contact resistance between the conductive shielding layer 7 and the cutting plane C of the via 24A is low. In the semiconductor package 1 used at the mobile device, it is required to make the magnetic field shielding effectiveness 34 dB or more at 900 MHz. Accordingly, it is preferable that the contact area resistivity between the conductive shielding layer 7 and the cutting plane C of the via 24A is set to be 300 mΩ·mm² or less. The contact area per one piece of via 24A is 0.0076 mm², and therefore, it is preferable that the resistance value at a contact interface between the cutting plane C of one piece of via 24A and the conductive shielding layer 7 is set to be 39Ω or less. Namely, it is preferable that the conductive shielding layer 7 is formed by a conductive material of which contact resistance with the cutting plane C of the via 24A becomes 300 mΩ·mm² or less, or a conductive material of which resistance value at the contact interface with the cutting plane C of one piece of via 24A becomes 39Ω or less.

Figure 11A:
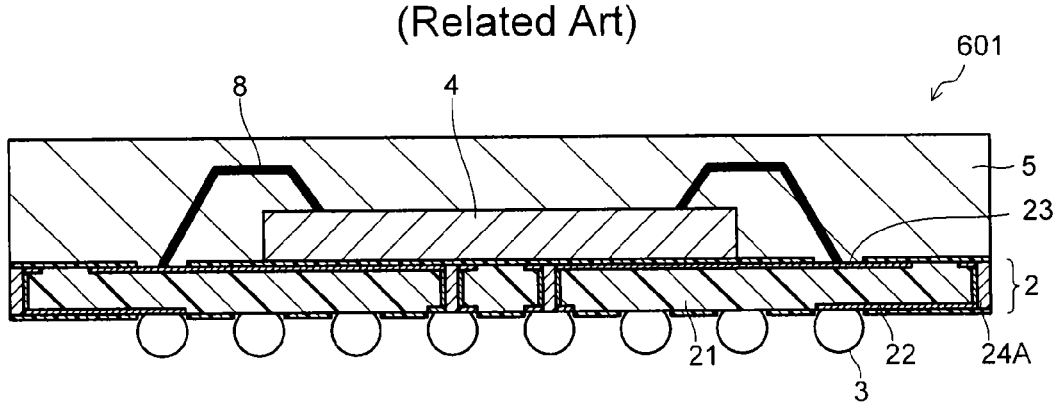
FIG. 11A to FIG. 11C are views illustrating a manufacturing process of the semiconductor package illustrated in FIG. 7.
Figure 11B:
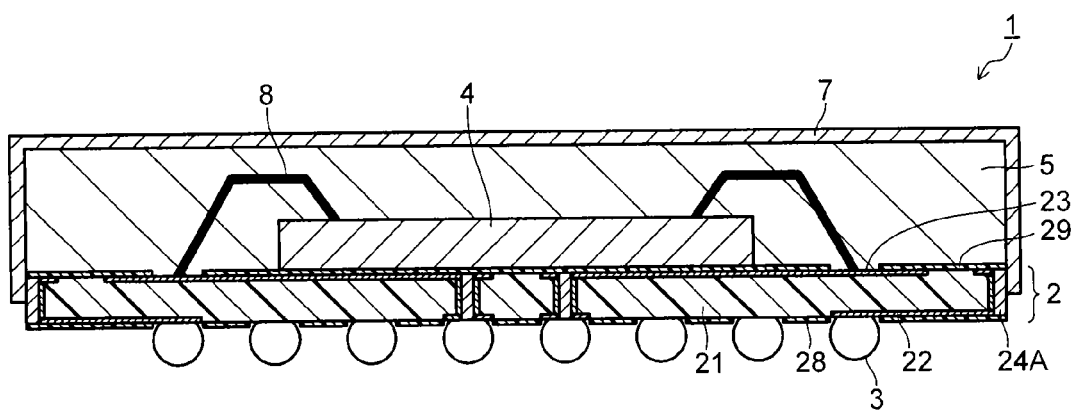

The semiconductor package 1 of this embodiment is manufactured as, for example, stated below. At first, FBGA 601 is manufactured by applying a conventional manufacturing process, as illustrated in FIG. 11A. The FBGA 601 is separated into pieces by the dicing. When the FBGA 601 is separated into pieces, the dicing is performed such that the cutting plane C of the via 24A is exposed to the side surface of the interposer board 2. Next, the encapsulant 5 is cured, and thereafter, the conductive shielding layer 7 is formed as illustrated in FIG. 11B. FIG. 11A and FIG. 11B represent the manufacturing process of the semiconductor package 1 illustrated in FIG. 7 and FIG. 8.

The conductive shielding layer 7 is formed by coating a conductive paste by means of, for example, a pad printing, a screen printing method, a spray coating method, a jet dispensing method, an ink-jet method, an aerosol method, and so on. The conductive paste contains, for example, silver, copper, and resin as major constituents, and the one of which resistivity is low is desirable. Besides, the conductive shielding layer 7 may be formed by applying a method depositing copper, nickel, or the like by means of a nonelectrolytic plating or an electrolytic field plating, or a method depositing copper or the like by means of a spattering method. The conductive shielding layer 7 is formed to cover the encapsulant 5 and at least a part of the side surface of the interposer board 2.

Figure 11C:
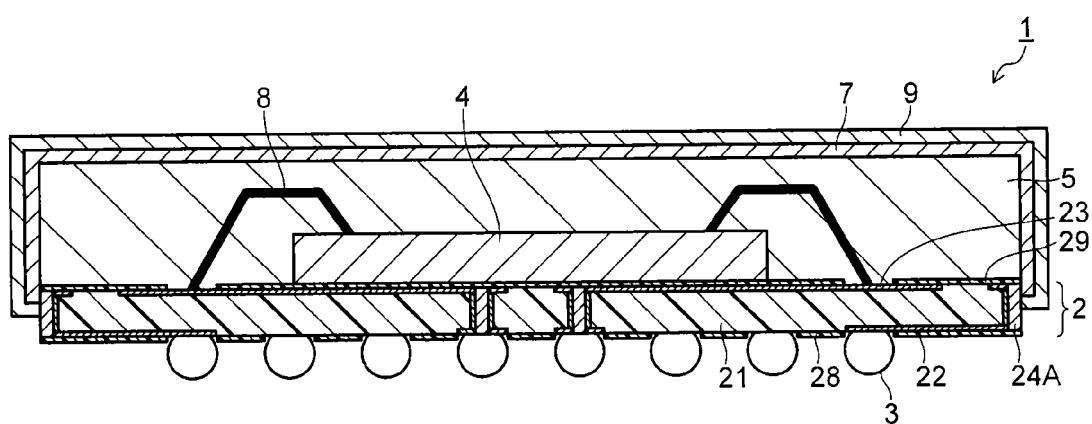

As illustrated in FIG. 11C, the conductive shielding layer 7 may be covered by a protective layer 9 superior in a corrosion resistance and an anti-migration property according to need. A polyimide resin and so on are used as the protective layer 9. After that, the semiconductor package 1 is manufactured by baking and curing the conductive shielding layer 7 and the protective layer 9. Printing is performed at the semiconductor package 1 according to need. The printing is performed by a printing by a laser, the pad printing, and so on.

It is also possible to manufacture the semiconductor package 1 of the present embodiment by performing a half-dicing before it is separated into pieces, and subsequently the dicing to separate into pieces is performed after the conductive shielding layer 7 is formed, as illustrated in FIG. 12A to FIG. 12E. FIG. 12A to FIG. 12E illustrate a manufacturing process of the semiconductor package 1 illustrated in FIG. 1 to FIG. 3.

At first, the one in which plural FBGAs 602a and 602b are sealed in a block by the encapsulant 5 is manufactured by applying the conventional manufacturing process, as illustrated in FIG. 12A. Next, the half-dicing is performed to cut the encapsulant 5 and a part of the interposer board 2 as illustrated in FIG. 12B. The half-dicing is performed such that a part of the via 24A in the thickness direction disposed at the outer peripheral part of the interposer board 2 is cut. The cutting plane C of the via 24A is formed by the half-dicing.

When the half-dicing is performed, there is a possibility that the vias 24A are separated from the interposer board 2 if the vias 24A are disposed at the four corners of the interposer board 2. It is preferable that the vias 24A are not disposed at the four corners of the interposer board 2 to avoid the separation. When the vias 24A are disposed at the four corners of the interposer board 2, and the vias 24A are separated from the interposer board 2 resulting from the half-dicing, it is possible to remove the separated vias 24A by making a dicing blade pass through again at the same position as a part where the half-dicing is performed. It is thereby possible to suppress occurrence of defects caused by the separation of the vias 24A.

Next, the conductive shielding layer 7 is formed to cover plural FBGAs 6a and 6b as illustrated in FIG. 12C. The conductive shielding layer 7 is formed such that it is filled in a dicing groove formed by the half-dicing. The solder balls 3 are set on the interposer board 2 in block in FIG. 12D, and thereafter, the dicing for separation into pieces is performed to manufacture the semiconductor package 1 as illustrated in FIG. 12E. The dicing for separation into pieces is performed to cut the conductive shielding layer 7 filled in the dicing groove and the remaining part of the interposer board 2. Note that the protective layer 9 is formed on the conductive shielding layer 7 before or after the dicing process for the separation into pieces when the protective layer 9 is applied as illustrated in FIG. 11C. The printing is performed at the semiconductor package 1 according to need.

Figure 13:
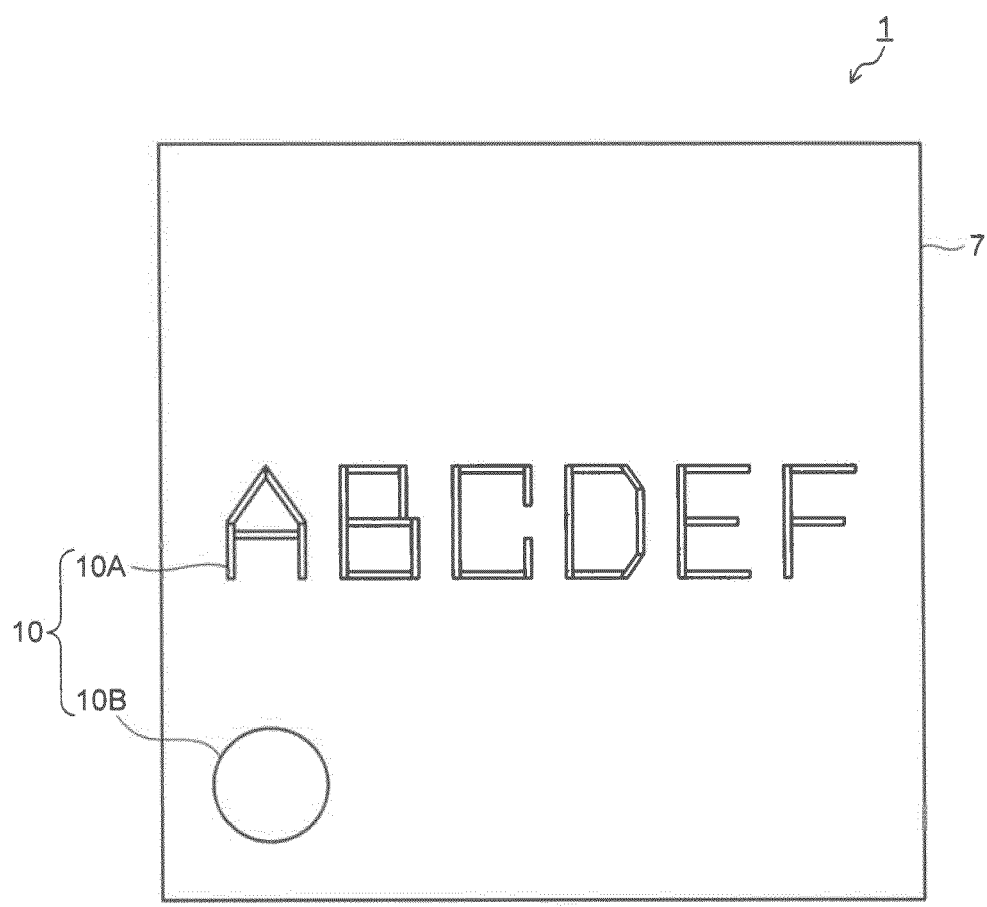
FIG. 13 is a top view of the semiconductor package illustrated in FIG. 1.

When identification marks 10 such as characters 10A, a mark 10B, and a figure are formed on a surface of the conductive shielding layer 7 of the semiconductor package 1 as illustrated in FIG. 13, there is a possibility that electromagnetic noise leaks from a formation part of the identification mark 10 if all of the conductive shielding layer 7 is carved off in the thickness direction and the encapsulant 5 is exposed. It is preferable that the identification marks 10 are formed by carving only a part of the conductive shielding layer 7 in the thickness direction. The identification marks 10 may be formed by a method of not carving the conductive shielding layer 7 but of transferring ink.

Figure 14:
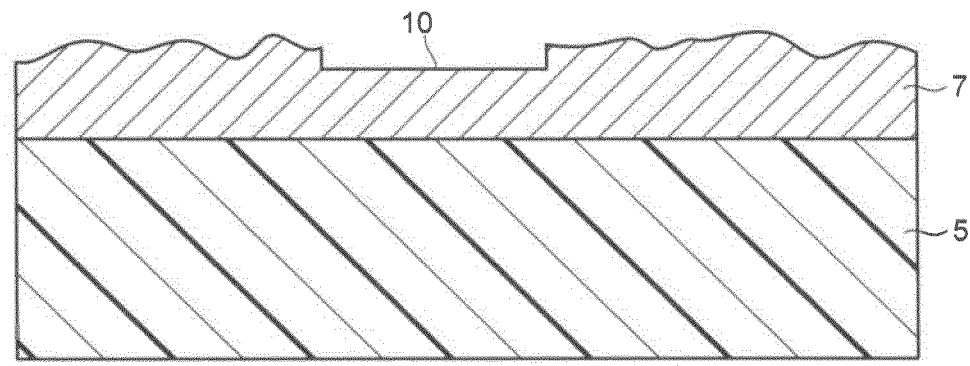
FIG. 14 is a sectional view enlargedly illustrating a part of the encapsulant and the conductive shielding layer of the semiconductor package illustrated in FIG. 13.

A laser marking adjusting laser output so as not to carve the conductive shielding layer 7 too much can be cited as a forming method of the identification marks 10. When the laser marking is performed at the conductive shielding layer 7, it is preferable that a surface roughness of the formation part of the identification marks 10 is changed from that of the other parts of the conductive shielding layer 7 by adjusting the laser output as illustrated in FIG. 14. For example, the surface roughness of the formation part of the identification marks 10 is made smaller than that of the other parts of the conductive shielding layer 7. It becomes possible to form the identification marks 10 with good visibility without largely carving the conductive shielding layer 7.

Figure 15:
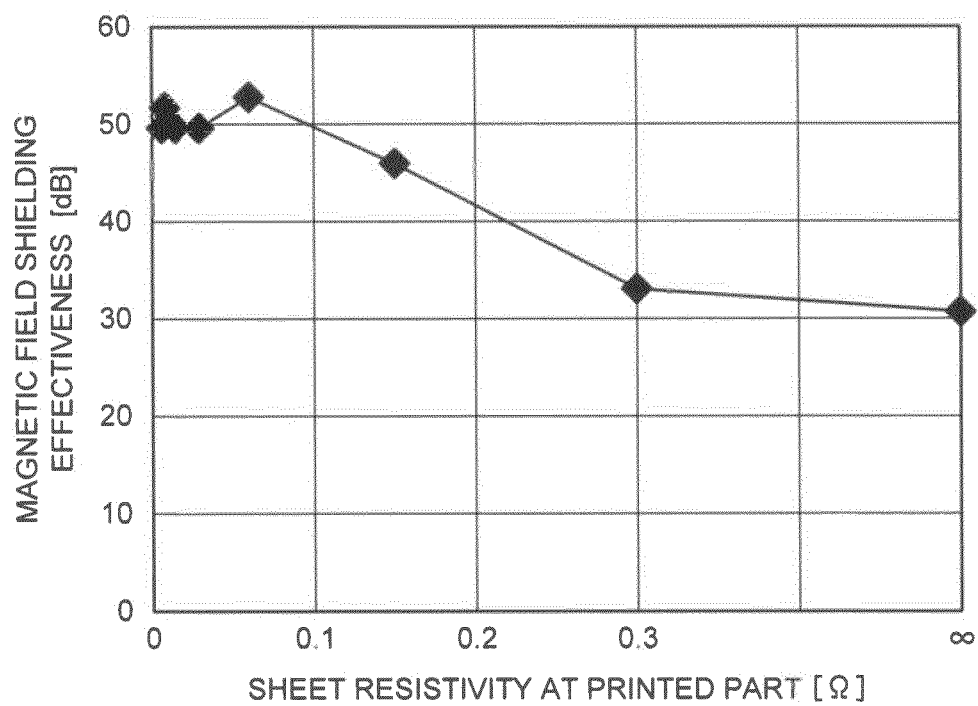
FIG. 15 is a view representing a relationship between a sheet resistivity at a formation part of identification marks at the conductive shielding layer and the magnetic field shielding effectiveness of the semiconductor package.

A result in which a relationship between a sheet resistance value at the formation part of the identification marks 10 at the conductive shielding layer 7 and the magnetic field shielding effectiveness is found by the electromagnetic field simulation is represented in FIG. 15 and Table 1. An analysis by means of the electromagnetic field simulation is performed as for a semiconductor package of which length of one edge is 8.1 mm, height (including the solder ball) is 1.06 mm. A specific shape of the semiconductor package is as follows: a height of the interposer board 2 is 0.1 mm; a diameter of the via 24A is 0.08 mm; a width of the land 27 of the via 24A is 0.2 mm; thicknesses of the first and second wiring layers 22, 23 are each 18 μm. The via 24A is the one in which copper is filled in the hole. When the conductive shielding layer 7 is in contact with an upper half of the cutting plane C of the via 24A, the contact area per one piece of via 24A becomes 0.0076 mm². The vias 24A are disposed with 1 mm pitch at a regular interval, and they are also disposed at the four corners of the interposer board 2. The number of vias 24A is 33 pieces.

The noise is terminated by feeding power from external to the solder balls, and by propagating from the solder balls to the board through the signal wiring of the interposer board and the vias. The conductive shielding layer, the exposed via, the ground wiring, the ground pins of the solder balls are electrically connected. An analysis frequency is set to be 900 MHz. The magnetic field strength is calculated at a position of 1 mm from the encapsulant just above the central part of the package (reference surface). The magnetic field shielding effectiveness is found from a difference between maximum values of the magnetic field strengths at the reference surface when a shielding layer exists and when the shielding layer does not exist. The thickness of the conductive shielding layer is set to be 50 μm both at the upper surface and the side surface of the package. The resistivity of the conductive shielding layer is 30 μΩcm, and the sheet resistance value of the conductive shielding layer is 0.006 Ω.

The identification marks 10 as illustrated in FIG. 13 are formed at the conductive shielding layer 7. A thickness of the character 10A is 0.08 mm, and a size of the character 10A is 1 mm invertical and 0.7 mm in horizontal. The mark 10B representing a direction of the package is a circle of which diameter is 1 mm. The identification marks 10 as illustrated in FIG. 13 are formed by carving the conductive shielding layer 7. A relationship with the electromagnetic field shielding effectiveness is analyzed while changing the thicknesses of the conductive shielding layer 7 at the formation part of the identification marks 10 from 0 μm to 50 μm. When the thickness of the conductive shielding layer 7 is 0 μm, the conductive shielding layer 7 at the mark formation part is in a state completely carved and lost, and the sheet resistance value in the case is infinite. When the thickness of the conductive shielding layer 7 is 50 μm, the conductive shielding layer 7 at the mark formation part is not carved, and the sheet resistance value in that case is 0.006Ω.

TABLE 1

| | Thickness of shielding layer at printed part [μm] | | | | | | | |
|---|---|---|---|---|---|---|---|---|
| | 50 | 40 | 20 | 10 | 5 | 2 | 1 | 0 |
| Sheet resistivity of shield layer at printed part [Ω] | 0.006 | 0.0075 | 0.015 | 0.03 | 0.06 | 0.15 | 0.3 | ∞ |
| Magnetic field shielding effectiveness [dB] | 50 | 52 | 50 | 50 | 53 | 46 | 33 | 31 |

As represented in FIG. 15 and Table 1, the magnetic field shielding effectiveness becomes high as the sheet resistance value at the formation part of the identification marks 10 at the conductive shielding layer 7 is low. In the semiconductor package 1 used at a mobile device, it is required to make the magnetic field shielding effectiveness 34 dB or more at 900 MHz. The sheet resistance value at the formation part of the identification marks 10 at the conductive shielding layer 7 is preferable to be set at 0.28Ω or less.

Figure 16:
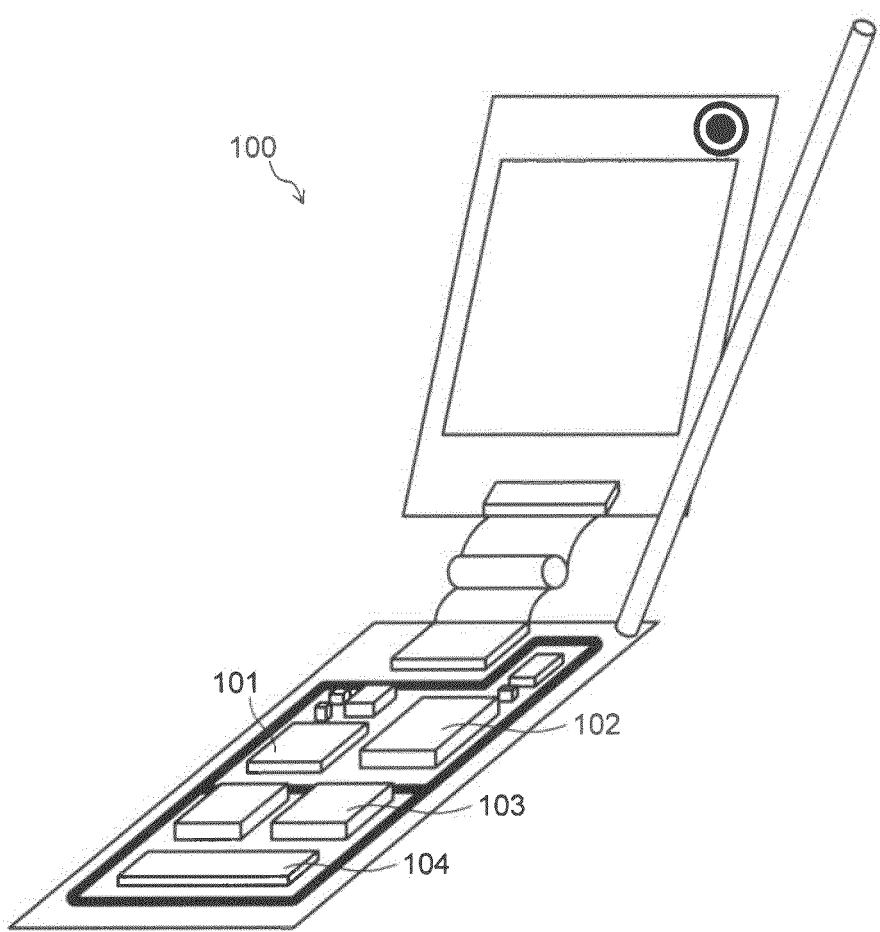
FIG. 16 is a perspective view illustrating a configuration of a cellular phone according to the embodiment.

The semiconductor package 1 of the above-stated embodiment is suitable for a mobile communication device such as a cellular phone and a mobile information terminal. FIG. 16 illustrates a cellular phone according to the embodiment. A cellular phone 100 illustrated in FIG. 16 includes a CPU package 101, a memory chip package 102, a tone generation chip package 103, a power chip package 104, and so on. These IC packages 101, 102, 103, 104 each become a noise source. The semiconductor package 1 of the embodiment is applied to these IC packages 101, 102, 103, 104, and thereby, it becomes possible to suppress the noise at the communication time of the cellular phone 100.

While certain embodiments have been described, these embodiments have been presented by way of example only, and are not intended to limit the scope of the inventions. Indeed, the novel methods described herein may be embodied in a variety of other forms; furthermore, various omissions, substitutions and changes in the form of the methods described herein may be made without departing from the spirit of the inventions. The accompanying claims and their equivalents are intended to cover such forms or modifications as would fall within the scope and sprit of the inventions.

What is claimed is:

1. A semiconductor device, comprising:
   a circuit substrate including an insulating layer, and a plurality of wirings provided on the insulation layer and containing copper, gold, silver or nickel;

a semiconductor chip mounted on the circuit substrate;

an encapsulant sealing the semiconductor chip;

a conductive shielding layer covering the encapsulant; and external connection terminals connected to the wirings, the wirings having a first portion and a second portion, the first and second portions being connected to a common via, a part of the first portion being exposed at a side surface of the circuit substrate, and a part of the second portion being exposed at the side surface of the circuit substrate, the exposed parts being electrically connected with the conductive shielding layer at the side surface, the exposed parts being electrically connected with at least one of the external connection terminals, and the exposed parts, the external connection terminal electrically connected to the exposed parts, and the conductive shielding layer electrically connected to the exposed parts being capable of becoming a ground potential.

2. The semiconductor device according to claim 1, wherein a distance between the part of the first portion and the part of the second portion is less than or equal to 4 mm.

3. The semiconductor device according to claim 1, wherein the conductive shielding layer has an identification mark, and the conductive shielding layer at a position of the identification mark has a thickness which a sheet resistance value of the position of the identification mark becomes 0.28Ω or less.

4. The semiconductor device according to claim 3, wherein a roughness of the conductive shielding layer at the position of the identification mark is lower than a roughness of the conductive shielding layer at the position not of the identification mark.

5. The semiconductor device according to claim 3, wherein the thickness of the conductive shielding layer at the position of the identification mark is thinner than a thickness of the conductive shielding layer at the position not of the identification mark.

6. The semiconductor device according to claim 1, further comprising:

a protection layer provided on the conductive shielding layer.

7. The semiconductor device according to claim 6, wherein the conductive shielding layer layer has an identification mark.

* * * * *